US006387827B1

(12) United States Patent
Mertens et al.

(10) Patent No.: US 6,387,827 B1
(45) Date of Patent: *May 14, 2002

(54) METHOD FOR GROWING THIN SILICON OXIDES ON A SILICON SUBSTRATE USING CHLORINE PRECURSORS

(75) Inventors: Paul Mertens, Haacht (BE); Michael McGeary, Meriden, CT (US); Hessel Sprey, Leuven (BE); Karine Kenis, Kessel-Lo (BE); Marc Schaekers, Heverlee (BE); Marc Heyns, Linden (BE)

(73) Assignees: Imec (vzw), Leuven (BE); ASM International, Bilthoven (NL); Olin, Cheshire, CT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/980,107

(22) Filed: Nov. 26, 1997

Related U.S. Application Data

(60) Provisional application No. 60/045,231, filed on Mar. 28, 1997, and provisional application No. 60/042,597, filed on Apr. 1, 1997.

(51) Int. Cl.$^7$ .................. H01L 21/31; H01L 21/469
(52) U.S. Cl. .................. 438/789; 438/774; 438/790
(58) Field of Search .................. 438/789, 790

(56) References Cited

U.S. PATENT DOCUMENTS 5,288,662 A  2/1994 Lagendijk et al. .......... 437/239
5,599,425 A  2/1997 Lagendijk et al.
5,721,176 A  2/1998 McGeary et al.

FOREIGN PATENT DOCUMENTS

EP  0 577 262 A2  *  5/1993
EP  0 577 262 B1  10/1996

OTHER PUBLICATIONS

V. Vermeire, et al., Effect of Different Chlorine Sources During Gate Oxidation, (UCPSS), pp. 143–146, 1994.*
P.W. Mertens, Effect of Cl in Gate Oxidation, (MRSSP), pp. 89–100, 1997.*
B.Y. Nguyen, et al., Insitu Pyrochemical Wafer Cleaning For Furnace Processing, Tech. Dig. 1993 Symp., on VLSI Technol. (ISAP, Tokyo, 1993), p. 109.
DeBusk, Damon, et al., Investigating a Trans–dichloroethylene Vapor Cleaning Process. Micro, Sep. 1995, p. 39.

* cited by examiner

*Primary Examiner*—Long Pham
*Assistant Examiner*—Scott Hawranek
(74) *Attorney, Agent, or Firm*—Knobbe, Martens, Olson and Bear LLP

(57) ABSTRACT

A method of growing a silicon oxide layer on a silicon substrate by means of a thermal oxidation in a furnace in the presence of a gaseous mixture, said mixture comprising oxygen and $Cl_2$, said $Cl_2$ being generated by an organic chlorine-carbon source, particularly oxalyl chloride. This method is directed to the growth of (ultra) thin silicon oxides and/or the cleaning of a substrate using a low oxidation power. Consequently the method disclosed is especially suited for temperature below 700° C. and for oxidation ambients containing only small amounts of oxygen.

15 Claims, 1 Drawing Sheet

1–2: WAFERS PUSHED INTO FURNACE
2–3: STABILIZATION
3–4: TEMPERATURE RAMP UP
4–5: TEMPERATURE STABILIZATION
5–6: OXIDATION STEP
6–7: TEMPERATURE COOL DOWN
7–8: UNLOAD WAFERS

FIG. 1  CHEMICAL STRUCTURES OF TCA, OC, AND DCE.
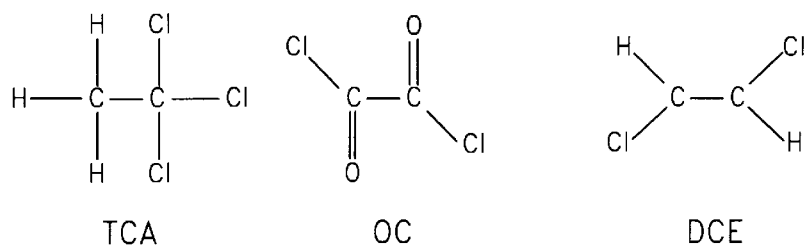
FIG. 2
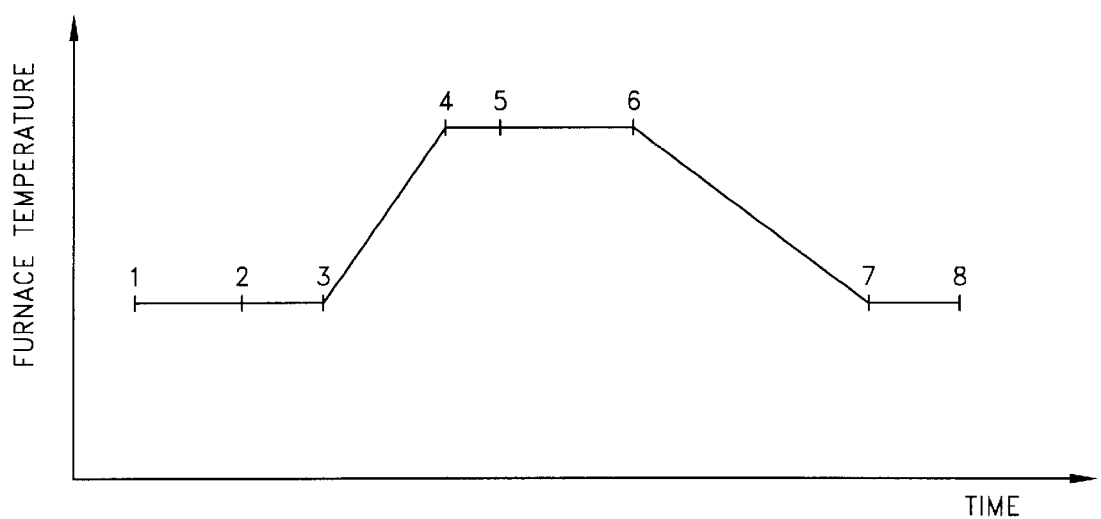
1–2: WAFERS PUSHED INTO FURNACE
2–3: STABILIZATION
3–4: TEMPERATURE RAMP UP
4–5: TEMPERATURE STABILIZATION
5–6: OXIDATION STEP
6–7: TEMPERATURE COOL DOWN
7–8: UNLOAD WAFERS

METHOD FOR GROWING THIN SILICON OXIDES ON A SILICON SUBSTRATE USING CHLORINE PRECURSORS

This application claims the benefit of U.S. Provisional Application No. 60/045,231, filed Mar. 28, 1997, and U.S. Provisional Application No. 60/042,597, filed Apr. 1, 1997.

FIELD OF THE INVENTION

The present invention is related to low oxidation power, i.e. at low temperature and low oxygen concentration, thermal oxidation processes in the presence of a chlorine source. Said processes can be used during the manufacturing of semiconductor devices. Specific examples of use of such processes are the growth of ultra-thin oxide layers, the Cl-cleaning of a substrate and the temperature ramp-up cycles prior to the oxide growth.

BACKGROUND OF THE INVENTION

In thermal oxidation processes the aim is to grow $SiO_2$ films by exposing silicon to $O_2$ at elevated temperatures. Historically chlorine has been introduced in the oxidation ambient in order to improve the electronic quality of gate oxide layers. Studies have revealed that the improvements by introducing chlorine are in fact initiated by the presence of $Cl_2$. Particularly the reduction of electronic instabilities, attributed to the presence of mobile ions mainly Na, has been emphasized. In addition, the use of Cl during gate oxidation was also found to result in a reduction of the density of dielectric breakdown defects and of stacking faults. It has been demonstrated that metal contamination on the wafer surface prior to gate oxidation has a distinct negative effect on the dielectric integrity of thin oxides. Particularly Ca has been identified as one of the most detrimental metals in that respect. The introduction of Cl in the oxidation ambient was found to be very efficient in removing metal contaminants, especially Ca, from the silicon wafer surface. In order to meet the stringent future gate-oxide defect density requirements, the residual concentration of metals and of Ca in particular has to be further reduced.

Most oxidation tools are now equipped for the introduction of chlorine species during silicon wafer oxidation and/or in situ tube cleaning operations. Several sources have been used to introduce chlorine. In order to compare these different methods a common parameter describing the concentration of the total amount of Cl fed to the reactor chamber, irrespective of its chemical state, is introduced. Said parameter is the "chlorine-equivalent concentration of a given Cl-source" and is defined as the ratio between "the total flow of Cl atoms [number of Cl atoms per unit time ] to the process chamber" and "the total flow of all molecules [number of molecules per unit time] to the process chamber".

In the past it was common practice to feed HCl gas to the oxidation furnace. Although this gas was effective for this application, its use has several drawbacks. Because of its corrosive nature, this gas deteriorates the metal distribution lines as well as the metal components in the gas management system. Such corrosion phenomena result in highly undesirable metallic contamination of the gases. Moreover the handling of the pressurized gas cylinders requires special care.

Because of these drawbacks the industry has used, 1,1,1-trichloroethane (TCA) as the source for Cl in the furnace. TCA is a volatile liquid and can be introduced into process tools via Teflon™ tubing thereby avoiding the corrosion phenomena faced with HCl. Since TCA has been identified as an ozone depleting substance, attacking the stratospheric ozone layer, its production, use and/or transportation has been restricted or even banned.

In response the industry has come up with ozonelayer-friendly replacement substances for TCA such as trans-1,2-dichloroethylene (DCE) and oxalyl chloride (OC). The replacement with DCE is the subject of the United States patent U.S. Pat. No. 5,288,662. The replacement with OC is the subject of the European Patent EP 0 577262 B1. In virtually all industrial practice of Cl-oxidation, a Cl-equivalent concentration of the Cl-source of 1–3% is used as illustrated by the example1 and comparison2of the European Patent EP 0 577262 B1 and in the United States patent U.S. Pat. No. 5,288,662. In general, when Cl-carbon precursors are used, care has to be taken to get a complete enough combustion of the molecule. Regarding said combustion, the chemistry for OC is substantially different from that for either one of TCA or DCE. Because OC contains no hydrogen, all the Cl in the precursor is made available in the process tube as $Cl_2$ (equation 1), provided of course that water is not deliberately added. In contrast, as in HCl itself, in the TCA and DCE molecules the number of hydrogen atoms equals the number of chlorine atoms. Therefore, during combustion, TCA (equation 2) and DCE (equation 3) are sources for HCl. Only a fraction, typically about 10%, of the so formed hydrogen chloride is (further) oxidized to form $Cl_2$ and $H_2O$, according to the equilibrium of the reaction (equation 4). It is obvious that said fraction depends on the parameters which affect the thermodynamical equilibrium like the percentage $O_2$ in the ambient. When this percentage is about 100%, said fraction is about 10%.

$$C_2Cl_2O_2 + O_2 \rightarrow Cl_2 + 2\ CO_2 \quad (1)$$

$$C_2H_3Cl_3 + 2\ O_2 \rightarrow 3\ HCl + 2\ CO_2 \quad (2)$$

$$C_2H_2Cl_2 + 2\ O_2 \rightarrow 2\ HCl + 2\ CO_2 \quad (3)$$

$$4\ HCl + O_2 \underset{pullout;zu885000.900}{\rightarrow} 2\ Cl_2 + 2\ H_2O \quad (4)$$

Consequently to ensure a complete combustion of TCA and DCE, the $O_2$ concentration should be very high (a multiple e.g 10-fold of the stoichiometrical requirement) and the temperature should be sufficiently high. Therefore in the state of the art applications of Cl-carbon precursors, the Cl-source is only on when the larger fraction of the process chamber ambient consists of $O_2$. Typically almost pure $O_2$ is used and only a smaller fraction of $N_2$ is added through the introduction of the Cl-carbon using a bubbler, as illustrated by the United States patent U.S. Pat. No. 5,288,662.

The ongoing downscaling of CMOS device dimensions, in particular the gate length, demands for an ongoing reduction of the gate oxide thickness in order to meet the required device performance specifications. With this required shrinkage of the thickness of high quality gate oxides, the use of organic molecules to introduce Cl in the furnace has become more critical. In order to obtain a good thickness control the process for growing thin oxides requires a milder overall oxidation condition, especially a low temperature treatment and a reduced oxygen concentration. Consequently, the organic Cl containing molecules will undergo also a milder oxidation, yielding the risc of only partial combustion of said molecules and risc of formation of highly toxic compounds like e.g. phosgene.

In recent years a new process was introduced referred to as the "pyro-clean", see B.-Y. Nguyen et al, in Tech. Dig. 1993 Symp. on VLSI Technol., (JSAP, Tokyo, 1993) p. 109.

In this process an in-situ low temperature Cl-treatment prior to the gate oxidation process is used. The motivation for this process is based on the fact that the diffusion constant and the solubility of a number of metals in silicon increases strongly with increasing temperature. The purpose of this process is to remove metallic contamination before the onset of diffusion of metal into bulk silicon. Typically a 30 minutes treatment at 650° C. is performed using an inert (e.g. $N_2$) ambient containing $O_2$ at a volume concentration of 2%. As a Cl source, HCl was chosen with a Cl-equivalent concentration of 3%. The addition of the small amount of oxygen is expected to be beneficial with regard to organic contamination, preventing destabilisation of the $SiO_2$ phase and limiting surface etching and roughening. At the same time the oxygen concentration should be kept low enough in order to limit the thickness of the oxide layer grown during this pre-oxidation step, particularly when the final oxide layers that are to be grown should be thin. The process conditions for the "pyro-clean" in B.-Y. Nguyen et al, in Tech. Dig. 1993 Symp. on VLSI Technol., (JSAP, Tokyo, 1993) p. 109 are a low temperature, a Cl-equivalent Cl-source concentration of 3% and a low oxygen concentration. In cited document HCl is used as a chlorine source. When using a chlorine-carbon source, it is obvious that this can result in a partial combustion, which is undesirable. Some early attempts in performing this process using TCA or DCE have even resulted in deposition of soot on the furnace wall and on the wafer surfaces, which is not possible when using OC. Moreover, even in an ambient with a high percentage of oxygen (even up to 100%) it is common knowledge that each of these substances have a minimum oxidation temperature below which a complete combustion is not possible. This minimum temperature is 800° C. for TCA, about 700° C. for DCE and as low as 400° C. for OC. As mentioned above, the use of the corrosive gas, HCl, in this process leads to potential danger of corrosion of the gas distribution system and is therefore undesirable.

In an attempt to avoid the use of a corrosive gas and to overcome partial combustion of a Cl-carbon precursor, another approach, making use of a separate burn-box, has been proposed e.g. by Damon DeBusk et al, Miocro Sept. 1995, p.39. In this additional burn-box the organic precursor can be oxidized before being introduced into the process chamber holding the wafers to be oxidized. The relatively higher $O_2$ concentration, the potentially higher temperature and a long residence time of the gases in this burn box, contribute to obtain a better combustion. But this process has some drawbacks. The burn-box solution requires additional hardware and/or software (a torch-like device and modification in control hard and/or software). The use of a burn-box for the gases to be burned first and particularly the increased residence time in the burn-box may limit the control over the reactor ambient, particularly with respect to switching of the ambient. This in turn can result in a degradation of process control. And finally the burn-box approach may only be marginal in solving the problem. Particularly in case of processes with a low oxygen concentration. To illustrate this an example making use of DCE is taken where a Cl-equivalent concentration of 3% is aimed. To convert DCE to HCl and $CO_2$ stoichiometrically requires 2 oxygen atoms per Cl atom. To convert DCE to $Cl_2$ and $CO_2$ stoichiometrically requires 2.5 oxygen atoms per Cl atom. In case of full combustion of DCE, i.e. all C converted to $CO_2$, typically a mixture of a larger fraction of HCl and a smaller fraction of $Cl_2$ is formed. Given said 3% Cl-equivalent concentration, an $O_2$, volume concentration of 3 to 3.5% is required just to stoichiometrically match for the combustion of DCE. A large $O_2$ excess, in the order of 10 times is typically required to obtain the same amount of $Cl_2$ and to obtain full combustion during the finite residence time. Consequently the overall $O_2$ volume-concentration in the process chamber will be above 30%. This is clearly a much too high value to match the "pyro-clean" process. This severally limits the application of this technique to processes with relatively high oxygen concentration.

The present invention provides a solution to overcome these drawbacks.

AIM OF THE INVENTION

It is the aim of the present invention to provide an efficient low oxidation power process that allows the growth of ultra-thin gate-oxides in a conventional furnace used in a standard CMOS IC-processing environment by using chlorine. Said process should avoid corrosion by using a Cl-carbon precursor and should at least maintain a performance equivalent to current HCl based processes.

SUMMARY OF THE INVENTION

In a first aspect of the invention a method is disclosed of in situ cleaning a silicon substrate by performing at least one heating step in a gas phase ambient comprising $Cl_2$ and preferably a very low concentration of oxygen, typically a volume concentration between 2% and 5% or below. This in situ Cl-clean can take place in a conventional oxidation furnace. Preferably said Cl-clean is performed in a gas phase ambient comprising the reaction products of oxygen ($O_2$) and an organic Cl-carbon based substance, preferably oxalyl chloride. Said reaction products can comprise oxygen, Cl-atoms and $Cl_2$. The aim of this in situ Cl-clean is to remove the metal surface contaminants before they can diffuse into the substrate.

In a second aspect of the invention a method is disclosed for growing a thin silicon oxide, preferably $SiO_2$, on a silicon substrate using a gas phase ambient comprising $Cl_2$. Said growth of silicon oxide can take place in a conventional oxidation furnace. More specifically a method is disclosed of growing said thin silicon oxide on said silicon substrate using a gas phase ambient comprising the reaction products of oxygen ($O_2$) and an organic Cl-carbon based substance, preferably oxalyl chloride. Said reaction products can comprise oxygen, Cl-atoms and $Cl_2$. Using the method of the invention a controlled growth of thin silicon oxide layer on a silicon substrate can be achieved with the thickness of said silicon oxide layer in the range of 0.1 to 1 nm or 1 to 8 nm or above 8 nm.

In a third aspect of the invention, a method is disclosed for growing a thin silicon oxide on a silicon substrate comprising at least two steps, in one step in an situ Cl-clean is performed and in another step a thin silicon oxide layer is grown on the silicon substrate using a gas phase ambient comprising the reaction products of oxygen and an organic Cl-carbon based substance, preferably oxalyl chloride. Using this method a controlled growth of a high quality thin silicon oxide layer on a silicon substrate can be achieved with the thickness of said silicon oxide layer in the range from 0.1 to 1 nm or 1 to 8 nm or above 8 nm.

Said substrates of said first, second and third aspect of the invention are kept at a temperature of 900° C. or below. The present invention includes temperature ranges from 500° C. to 550° C., from 550° C. to below 700° C. and from 700° C. to 900° C. Preferably a temperature of 650° C. is used. Heating steps are typical in the range up to 30 minutes or 80 minutes or higher, but the invention is not limited thereto. In particular even oxidation or anneal times in the order of seconds may be used but such short anneal times usually require the use of pre-burning box. Furthermore a low Cl-equivalent concentration of oxalyl chloride in the gas phase ambient is used. Said Cl-equivalent concentration of oxalyl chloride can be in this range of about 0.001–0.3%. Said Cl-equivalent concentration of oxalyl chloride can also be in the range of 0.3–0.5% or in the range of about 0.5–1%. Higher concentrations can also be used. The gas phase ambient can also further comprise other gases or compounds that do not influence the efficiency of the method or that do not introduce contaminants in the grown silicone oxide. The gas phase ambient that is used can further comprise hydrogen or water steam but this reduces the efficiency.

In a further aspect of the invention a method of growing a silicon oxide layer on a silicone substrate by means of a thermal oxidation in a furnace is disclosed, comprising the steps of:

heating said substrate in said furnace, preferably said heating is executed in at least one step to at least one temperature typically in the range from 500° C. to 1000° C.;

flowing a gaseous mixture into said furnace, said mixture comprising oxygen and $Cl_2$, said $Cl_2$ being generated by an organic chlorine-carbon source, while keeping said furnace at a temperature below 700° C.;

holding said silicon substrate in said furnace until said silicon oxide layer on said substrate is formed.

In still a further aspect of the invention a method of growing a silicon oxide layer on a silicon substrate by means of a thermal oxidation in a furnace is disclosed, comprising the steps of:

heating said substrate in said furnace;

flowing a gaseous mixture into said furnace while keeping said furnace at a temperature below 900° C., said mixture comprising oxygen and $Cl_2$, said oxygen having a volume concentration of 5% and below, said $Cl_2$ being generated by an organic chlorine-carbon source;

holding said silicon substrate in said furnace until said silicon oxide layer on said substrate is formed.

BRIEF DESCRIPTION OF THE DRAWINGS

FIG. 1 presents the chemical structure of TCA, OC and DCE.

FIG. 2 shows a scheme of the furnace temperature versus the time of a simplified exemplary oxidation process according to an embodiment of the invention.

DETAILED DESCRIPTION OF THE INVENTION

In relation to the appended drawings the present invention is described in detail in the sequel. Several embodiments are disclosed. It is apparent however that a person skilled in the art can imagine several other equivalent embodiments or other ways of practising the present invention e.g. by using equivalent chlorine sources, the spirit and scope of the present invention being limited only by the terms of the appended claims.

In an embodiment of the invention a method is disclosed in situ cleaning a silicon substrate by performing at least one heating step in a gas phase ambient comprising $Cl_2$. This in situ Cl-clean can take place in a conventional oxidation furnace. The Cl is generated from a Cl-source that works at a low oxygen concentration and at a low temperature. This is realised by using a well chosen concentration of an appropriate Cl-source that readily combusts even at temperatures of 700° C. or below. Additionally said Cl-source is chosen such that the same performance as with HCl as a source can be obtained at much lower Cl-equivalent concentrations and thus typically a low stoichiometric amount of oxygen is required for the combustion of the Cl-source. A Cl-source being efficient means that an equivalent performance is obtained at much lower Cl-equivalent concentrations than for conventional sources. An efficient source converts all of its Cl or at least a large fraction of its Cl into $Cl_2$.

Taking all thes aforementiond requirements into account, a good example of such a Cl-source is oxalyl chloride. Also other equivalent organic Cl-carbon sources e.g. having chemical formula $C_xCl_yO_zH_t$, x, y and z being each one of 1, 2, 3 or 4 and t being one of 0, 1, 2, 3 or 4 which meet said requirements, and therefore readily combust even at temperatures of 700° C. or below, can be used. Preferably t is smaller than or equal to y. Therefore said Cl-clean uses a gas phase ambient comprising the reaction products of oxygen ($O_2$) and said organic Cl-carbon source (preferably OC). Said reaction products can comprise oxygen, Cl-atoms and $Cl_2$. The aim of this in situ Cl-clean is to remove the metal surface contaminants before they can diffuse into the substrate. The substrates are kept at a temperature of 900° C. or below. The invention also includes temperatures in the range from about 500° C. to 550° C., from 550° C. to below 700° C. and from 700° C. to 900° C. Preferably a temperature of 650° C. is used. Heating steps are typical in the range up to 30 minutes or 80 minutes or higher, but the invention is not limited thereto. In particular even anneal times in the order of seconds may be used but such short anneal times usually require the use of a pre-burning box. Furthermore a low Cl-equivalent concentration of the Cl-source, preferably oxalyl chloride, in the gas phase ambient is used. Said concentration of oxalyl chloride can be in the range of about 0.001% to 0.3%. Said concentration of oxalyl chloride can also be in the range of 0.3% to 0.5% or in the range of about 0.5%–1%. Higher concentrations can also be used. The ratio between the total number of Cl atoms and the total number of O atoms should be kept below 0.1 or preferably even below 0.05. The lower the oxidation temperature and the lower the volume concentration of $O_2$ in the furnace the lower said ratio should be chosen. The gas phase ambient can also further comprise other gases or compounds that do not influence the efficiency of the method or that do not introduce contaminants in the grown silicon oxide. The gas phase ambient that is used can further comprise hydrogen or water stream but this reduces the efficiency.

In a preferred embodiment of the invention a specific experiment of an in situ Cl-clean is disclosed. In the experiment oxalyl chloride (OC) was used as a chlorine source (Source in table 1). The heating step took place in an oxidation furnace, namely in an ASM A600, at a temperature of 650° C. during 30 minutes and with an $O_2$ volume concentration ($O_2$ in table 1) of 2%. The major component of the gas phase was nitrogen. Three different Cl-equivalent concentrations (Cl-eq. in table 1) of OC were tried out respectively 1, 0.3 and 0.05%. Also the ratio between the total number of Cl atoms and the total number of O atoms is given as an input parameter in table 1. This experiment was compared with two references. The first reference did use a conventional HCl-source as a Cl-source with a Cl-equivalent concentration of 3% (this is the conventional "pyro-clean"). Another reference was carried out without any Cl addition. As a specific example, the detailed description of the process conditions for one particular set of input parameters for the experiment is disclosed:

detailed part of the experiment: OC: 0.05% Cl-eq.+2% $O_2$,
WAFERS: diameter: 150 mm
orientation: <100>
doping type: p-type
oxidation furnace: ASM A600
load ambient: 25% $O_2$ in $N_2$
load temperature: 650° C.
AMBIENT:
total pressure: atmospheric
clean ambient: 200 sccm $O_2$, 9785 sccm $N_2$
clean temperature: 650° C.
time: 30 min
BUBBLER:
ox.Cl: 2.5 sccm
bubbler temp.: 12° C.
$Flow_c/Flow_s$ (at 12° C.): 4.961
carrier ($N_2$) flow setting: 12.4 sccm
reading: 12–13 sccm
source:Cl-eq setting: 0.05%
reading: 0.05–0.06% (12–13 sccm $N_2$ carrier flow)

The substrates were measured to control the thickness (tox in table 1) of the oxide layer grown. The thickness is determined with ellipsometry; the measurement tool used is: Plasmos, SD Version 6.28G, Ser. No.: 5062.03.93. Light-scattering haze measurements (haze in table 1), performed with the measurement tool Censor ANS100, provided a control for morphological integrity of the wafer surface. Also measured was the amount of Carbon incorporation (C incorp. in table 1), by means of polysilicon encapsulates SIMS, into the oxide films. Further measured was the removal efficiency of Ca (CA remov. in table 1) and Fe (Fe remov. in table 1) surface contamination which was intentionally put on dedicated substrates. The surface contamination level was measured with vapour phase decomposition-droplet surface etching-total reflectance X-ray fluorescence (VPD-DSE-TXRF). For the TXRF measurements an Atomika TXRF 8010 is used. The target value for the initial concentration of said contamination was $10^{12}$ at. $cm^{-2}$. An overview of the input parameters and the results of the experiment is presented in Table 1. For the experiments without a chlorine source and with HCl as a chlorine source, the results of two runs, each having the same input parameters, are presented to demonstrate the repeatability.

It can be seen in table 1 that for the conditions used the oxide thickness, haze, Fe-removal and particularly the carbon incorporation tend to correlate with the Cl/O ratio. The OC process with the highest Cl-equivalent concentration (1%) and a relatively high Cl/O ratio results in an anomalous fast oxide growth and a significant increase of the haze.

The carbon incorporation for the OC processes is clearly correlated with the Cl/O ratio. It is an indication of partially combusted OC in the oxidation ambient. In order to limit the carbon incorporation, one should avoid Cl/O ratios above 0.1.

The Ca removal was found to be outstanding for all cases with Cl in the ambient, and for the conditions using OC in particular.

Almost all OC processes have a Fe-removal efficiency which is comparable with the conventional pyro-clean using HCl. Except for the OC process with the highest Cl-equivalent concentration, where the Fe-removal efficiency is significantly higher, but on the other hand this process did result in a higher carbon incorporation.

Oxalyl chloride (OC) with a Cl-equivalent concentration of 0.05% yields good results while OC with a Cl-equivalent concentration of 1.0% yields undesirable results.

In summary it can be concluded that oxalyl chloride (OC), chemical formula $C_2Cl_2O_2$, as Cl-source with a Cl-equivalent concentration of about 0.05% yields the same performance as HCl as a Cl-source with a Cl-equivalent concentration of about 3%. Consequently especially at low temperatures and low oxygen concentrations, OC is much more efficient (by a factor of approximately 60) than HCl.

In another embodiment of the invention a method is disclosed of growing a thin silicon oxide, preferably $SiO_2$, on a silicon substrate using a gas phase ambient comprising $Cl_2$. Said growth of silicon oxide can take place in a conventional oxidation furnace. The Cl is generated from a Cl-carbon precursor that works with a low oxygen concentration and at a low temperature. These restrictions limit the choice of the Cl-source as already described above. Therefore the preferred Cl-source is oxalyl chloride. And thus in particular a method is disclosed of growing said thin silicon oxide on said silicon substrate using a gas phase ambient comprising the reaction products of oxygen ($O_2$) and oxalyl chloride. Said reaction products can comprise oxygen, Cl-atoms, $Cl_2$. Using this method a controlled growth of a thin silicon oxide layer on a silicon substrate can be achieved with the thickness of the silicon oxide in the range of 1 nm to 8 nm or above. Also a thickness in the range from 0.1 nm to 1 nm is possible, such ultra-thin layers are e.g. grown to provide a well defined interfacelayer for poly-emitters in bipolar devices in order to guarantee a sharp transition between the polycrystalline emitter layer and the monocrystalline substrate. The heating step(s) for the growth of a thin silicon oxide layer are performed at a temperature of 900° C. or below. The present invention also includes temperatures in the range from about 500° C. to 550° C., to below 700° C. and from 700° C. to 900° C. Preferably a temperature of

TABLE 1

Overview of experimental conditions and major results for 650° C. 30 min treatments in an oxidation furnace.

| Source | $O_2$ % | Cl-eq. % | Cl/O | tox nm | haze ppm | C incorp. $10^{13}$ $cm^{-2}$ | Ca remov. % | Fe remov. % |
|---|---|---|---|---|---|---|---|---|
| — | 2 | 0 | 0 | 1.5 | 0.067 | 0.016 | <14 | <21 |
| — | 2 | 0 | 0 | 1.86 | 0.066 | 1.3 | 0 | <23 |
| HCl | 2 | 3 | 0.75 | 1.7 | 0.067 | 0.075 | 85 | 49 |
| HCl | 2 | 3 | 0.75 | 2.1 | 0.066 | 0.24 | >98 | 61 |
| OC | 2 | 1 | 0.25 | 11.5 | 0.87 | 20 | >98 | 75 |
| OC | 2 | 0.3 | 0.075 | 3.6 | 0.080 | 2 | >98 | 57 |
| OC | 2 | 0.05 | 0.013 | 2.3 | 0.067 | 0.2 | >98 | 55 |

650° C. is used. Heating steps are typical in the range up to 30 minutes or 80 minutes or higher, but the invention is not limited thereto. In particular even anneal times in the order of seconds may be used but such short anneal times usually require the use of pre-burning box. Furthermore a low Cl-equivalent concentration of oxalyl chloride in the gas phase ambient is used. Said concentration of oxalyl chloride can be in the range of about 0.001–0.3%. Said concentration of oxalyl chloride can also be in the range of 0.3–0.5% or in the range of about 0.5–1%. Higher concentrations can also be used. The $O_2$ volume concentration in the ambient can range from 0.1% to 5% or in the range from 5% to 100%. The gas phase ambient that is used can further comprise hydrogen or water steam. The gas phase ambient can also further comprise other gases or compounds that do not influence the efficiency of the method or that do not introduce contaminants in the grown silicon oxide.

Characteristic about the Cl-clean and the growth of a thin silicon oxide described in the above embodiments is that there is $O_2$ and $Cl_2$ in the gas phase ambient, that a conventional oxidation furnace is used and that a silicon oxide is grown. As a consequence the method of the invention can be applied for each process which includes heat treatment steps and where at least traces of oxygen and chlorine are present in the ambient. In industrial processes this implies, growth of (ultra) thin oxides, pyro-clean processes, densification anneals but also more generally the use of Cl while the substrates are in the furnace, prior to the real oxidation step, this could be for e.g. a pryo-clean, a temperature ramp up and a temperature stabilisation prior to the oxidation step. These applications are characterised by a dilute $O_2$ ambient and/or low process temperature. To better explain this simple generic example of an oxidation process performed in a furnace is considered (see FIG. 2). Typically after bringing the substrates in the furnace (1–2), the furnace can be held at a constant temperature, the loading temperature, in order to allow the substrates to obtain the loading temperature (2–3). Then the temperature is increased to the nominal oxidation temperature (3–4). After a stabilisation step at the oxidation temperature (4–5) the real oxidation process starts (5–6). Finally the temperature is ramped down to the "unloading" temperature (6–7) and the substrates are unloaded (7–8). In general the oxide growth should be limited except during the actual oxidation step (5–6). Therefore from 1 to 5 the oxygen concentration in the furnace is chosen low. Also after the oxidation step (i.e. from 6 to 8) the oxidation is kept low by the freshly grown oxide that acts as a diffusion barrier for oxygen and by keeping the oxygen concentration in the furnace low.

In practical oxidation processes the temperature evolution can be more complex, more "plateaus" can be built in the temperature-time evolution during which different steps can be performed. The oxidation steps can consist of several sub-steps (e.g. switching between wet and dry oxidation). The stabilisation time at the loading temperature can be taken essentially zero.

However, the application of the method of the invention can be illustrated using the simplified generic description of an oxidation process. The Cl process that is the subject of this invention allows the use of Cl throughout almost the entire oxidation process (i.e. from 2 till 7):

The use of the Cl process during 2 to 3 is then a Cl-clean.

The use of the Cl process ramp up and stabilisation (3 to 5).

The use of the Cl during oxidation (5 to 6) even if the oxidation ambient contains only a relatively small fraction of $O_2$ and eventually the use of Cl during ramp down (6 to 7).

As an example of such a multi-step method, a method is disclosed comprising at least two steps, in one step an in situ Cl-clean is performed and in another step a thin silicon oxide layer is grown on the silicon substrate using a gas phase ambient comprising the reaction products of oxygen and an organic Cl-carbon based substance, preferably oxalyl chloride. Using this method a controlled growth of a high quality thin silicon oxide layer on a silicon substrate can be achieved with the thickness of said silicon oxide layer in the range of 1 nm to 8 nm above.

What is claimed is:

1. A method of growing a silicon oxide layer on a silicon substrate by thermal oxidation in a furnace having a single chamber, comprising the steps of:

heating said substrate in said chamber;

providing a gaseous mixture in said chamber, said mixture comprising oxygen and an organic chlorine-carbon source at a temperature below 700° C., wherein the oxygen has a volume concentration in the range from 0.1 to 5%, and wherein the ratio of the total number of Cl atoms to the total number of O atoms in the gaseous mixture is about 0.1 or below; and holding said silicon substrate in said chamber until said silicon oxide layer on said substrate is formed, said silicon oxide layer having a thickness in the range from 0.1 nm to 8 nm and a haze of less than 0.87 ppm.

2. A method as recited in claim 1 wherein said chlorine source is a chemical substance which is selected to completely combust under the stated conditions and has a chemical formula $C_xCl_yO_zH_t$, x, y and z being each one of 1, 2, 3 or 4 and t being one of 0, 1, 2, 3 or 4 and t being smaller than or equal to y.

3. A method as recited in claim 1 wherein said chlorine source is oxalyl chloride having the formula $C_2Cl_2O_2$.

4. A method as recited in claim 1 wherein said furnace is kept at a temperature in the range selected from 500° C. to 650° C. while flowing said mixture into said furnace.

5. A method as recited in claim 1 wherein said silicon oxide layer has a thickness in the range selected from 1 nm to 8 nm.

6. A method as recited in claim 1, wherein said heating is performed in at least one time period, and such that at the beginning of each time period the temperature has a predetermined first value while at the end of each time period said temperature has a predetermined second value.

7. A method as recited in claim 6 wherein said first and said second value of the temperature are in the range from 500° C. to 1000° C.

8. A method as recited in claim 1, wherein the ratio between the total number of Cl atoms and the total number of O atoms is in the range of from 0.075 and below.

9. A method as recited in claim 1, wherein the ratio between the total number of Cl atoms and the total number of O atoms is in the range of from 0.013 and below.

10. A method as recited in claim 1 wherein the volume concentration of said $O_2$ is 2% and below.

11. A method as recited in claim 1, wherein the ratio between the total number of Cl atoms and the total number of O atoms is in the range of from 0.05 and below.

12. The method as recited in claim 1 wherein said organic chlorine-carbon source is generating Cl- and $Cl_2$-molecules.

13. The method as recited in claim 1 wherein said method additionally comprises cleaning said silicon substrate or said silicon oxide layer.

14. The method as recited in claim 13, wherein the cleaning comprises heating at a temperature below 700° C.

15. A method as recited in claim 1, wherein the haze is less than or equal to 0.080 ppm.

* * * * *